(12) United States Patent
Shimoda

(10) Patent No.: US 6,188,266 B1
(45) Date of Patent: Feb. 13, 2001

(54) ELECTRICAL SIGNAL DELAY CIRCUIT

(75) Inventor: Sadashi Shimoda, Tokyo (JP)

(73) Assignee: Seiko Instruments Inc. (JP)

( * ) Notice: Under 35 U.S.C. 154(b), the term of this patent shall be extended for 0 days.

(21) Appl. No.: 08/216,807

(22) Filed: Mar. 23, 1994

(30) Foreign Application Priority Data

| Apr. 2, 1993 | (JP) | ................................................... 5-077168 |
| Apr. 2, 1993 | (JP) | ................................................... 5-077169 |
| Apr. 2, 1993 | (JP) | ................................................... 5-077170 |

(51) Int. Cl.[7] ............................................... H03K 17/296
(52) U.S. Cl. ........................... 327/393; 327/142; 327/143
(58) Field of Search .................................. 327/393, 142, 327/143

(56) References Cited

U.S. PATENT DOCUMENTS

| 4,260,907 | * | 4/1981 | Winebarger | 377/31 |
| 4,503,344 | * | 3/1985 | Brillhart | 307/594 |
| 4,591,745 | * | 5/1986 | Shen | 307/592 |
| 4,614,880 | * | 9/1986 | Go et al. | 307/200 A |
| 4,698,531 | * | 10/1987 | Jones | 307/592 |
| 4,885,476 | * | 12/1989 | Mahabadi | 307/272.3 |

* cited by examiner

Primary Examiner—Margaret R. Wambach
(74) Attorney, Agent, or Firm—Adams & Wilks

(57) ABSTRACT

By utilizing a plurality of charge storing elements, a delay circuit may be reduced in size and cost. A delayed output signal is produced a predetermined time period after detection of an input signal by selectively charging and discharging each of a plurality of charge storage units either concurrently or successively and by detecting the charge level of each respective charge storage element. When the charge level of the respective charge storing elements indicates that a predetermined period of time has transpired since detection of the input signal, a delayed output signal is generated. This operation is performed in one embodiment by simultaneously charging two capacitors, comparing the voltage level of one capacitor with a reference potential, and inverting an output signal when the level reaches the predetermined reference potential. The second capacitor is used to tie the output to this level while the first capacitor discharges. In another embodiment, capacitors are charged and discharged in cycles and a counter is used to count the number of charge/discharge cycles. When the count reaches a predetermined number, the output signal is generated. Accordingly, a delay circuit may be produced without the need for large capacitors and resistors and may be formed in a monolithic integrated circuit.

12 Claims, 9 Drawing Sheets

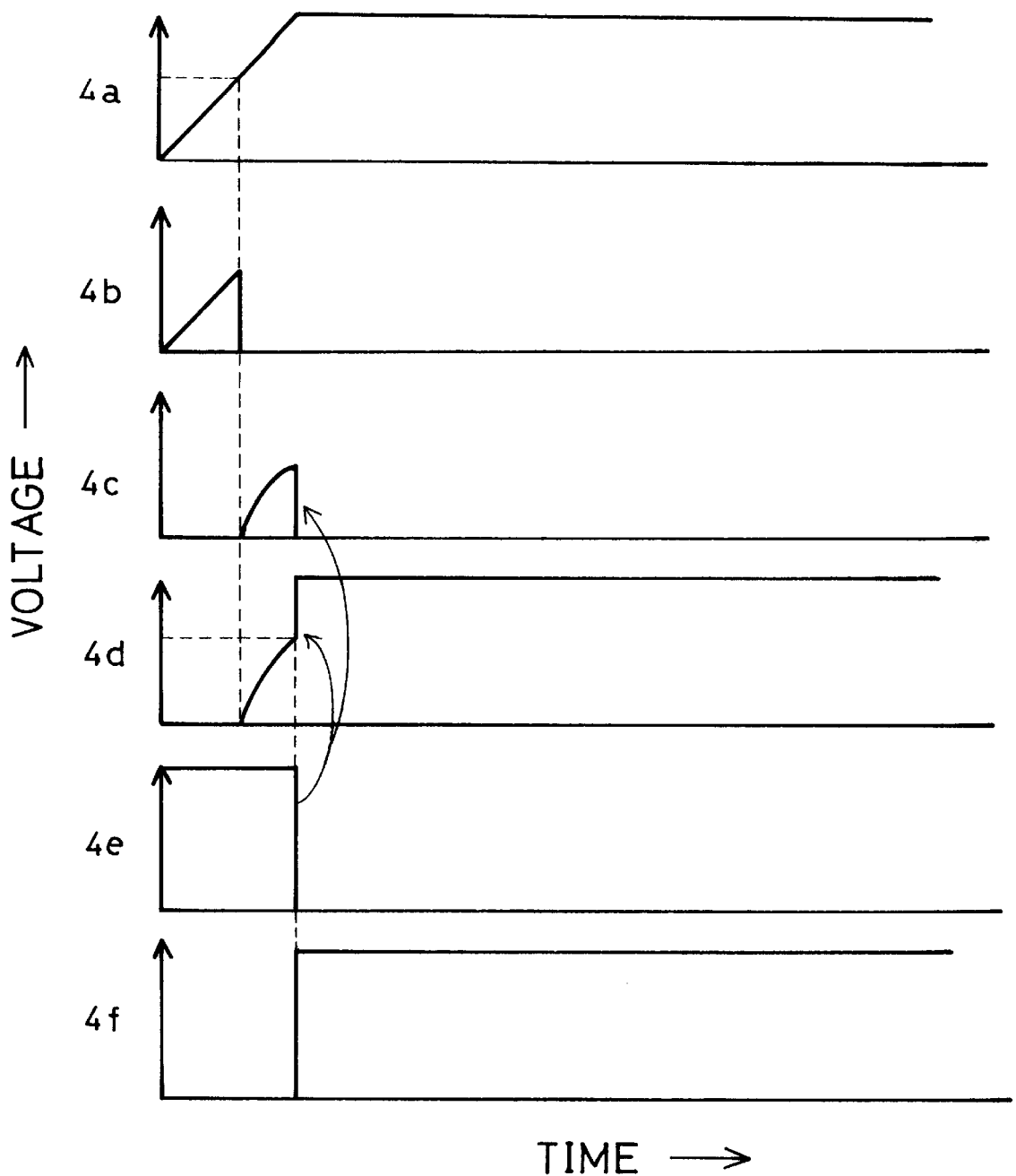
F I G. 4

ELECTRICAL SIGNAL DELAY CIRCUIT

BACKGROUND OF THE INVENTION

The present invention relates to an electrical signal delay circuit integrated in a monolithic IC and more particularly, to a circuit which outputs delay time.

In a conventional voltage detector circuit with delay function, a voltage detector circuit shown in the circuit block diagram of FIG. 9 is known. Namely a comparator 902 compares a voltage supplied from a center tap of a resistor group connected between a positive power source $V_{DD}$ and a negative power source $V_{SS}$, and standard voltage 901. An output of the comparator 902 is delayed by an RC time constant circuit comprising a resistor 903 and a capacitor 904.

However, the conventional voltage detector circuit with delay function has the following problem if it is integrated in a monolithic IC. Namely a resistor of several hundred megohm and a capacitor of several microfarad are needed for the delay of several hundred millisecond. It is impossible to form this large resistance and capacitance on a monolithic IC since no other resistor of several megohm and capacitor of several pico farad, even if these are maximum, can be commonly formed on the monolithic IC.

Although the resistor of several megohm and condenser of several pico farad are formed on the monolithic IC for the delay of several milliseconds, a voltage detector circuit integrated in a monolithic IC is not realized practically because of a large change of delay time by a temperature change of resistance value.

An object of the present invention is to provide an electric signal delay line circuit and a voltage detector circuit with delay function which is practical, has a good transfer characteristic and can be integrated in a monolithic IC for overcoming the conventional problem.

SUMMARY OF THE INVENTION

In order to overcome the above-noted problem, a main capacitor and sub-capacitor start to charge at the same time from the same current source in an electrical signal delay circuit in one embodiment of the present invention. When the main capacitor charges to a predetermined voltage, the main capacitor stops charging and starts to discharge. As the sub-capacitor completes charging, a comparator circuit is latched by the charge completion signal for generation of a constant delay time.

Also in the voltage detector circuit in another embodiment of the present invention, an RC time constant circuit comprising two groups of capacitors and resistors generates a time delay. In more detail, the voltage detector circuit comprises a transistor which charges a more charging capacitor until the voltage reaches power source voltage, a transistor which discharges another capacitor in charging till the voltage reaches ground voltage and a transistor which isolates two RC time constant circuits.

Also, at least two charge/discharge circuits with a capacitor may be formed in the voltage detector circuit of the present invention. Each capacitor charges alternately from current source. In detail, the first capacitor charges. The first comparator detects when the charge voltage of the first capacitor reaches a predetermined voltage value and at such time the first latch circuit starts to discharge the first capacitor and starts to charge the second capacitor at the same time. The second comparator starts to charge. The second capacitor detects when the terminal voltage reaches another pre-determined voltage value and at that time the second latch circuit starts to discharge the second capacitor and starts to charge the first capacitor at the same time. A counter circuit counts the number of charge cycles of the first capacitor by the repeat of the above operation and generates an output signal when the count reaches the predetermined number of times. Namely the structure controls charge/discharge by feeding back the output of one charge/discharge circuit to another charge/discharge circuit. Also, in this aspect of the invention, the delay signal generating circuit comprises a counter circuit counting the number of charge cycles, voltage detector means detecting the charge/discharge voltage level of each charge/discharge means and latch means memorizing the output for a time.

Also, two capacitor groups each comprising two capacitors respectively, may be provided in the electric signal delay circuit. Each capacitor group charge/discharges alternately. In detail, while one capacitor group charges, other capacitor group discharges. The time delay is determined by multiplying the charge/discharge time of one charge cycle by the count value of the total number of cycles of charge/discharges. Namely, in this aspect of the invention, the delay circuit comprises a starter circuit setting up a starting timing of delay, the first and the second charge/discharge circuits charge/discharge in accordance with the signal of the starter circuit, delay signal generating circuit which detects the voltage level of each charge/discharge circuit and generates an electric signal after a predetermined delay time. Each charge/discharge circuit controls charge/discharge of each other in the delay signal generating circuit by an output of another charge/discharge circuit. Consequently, the charge/discharge of each circuit repeats, and the charge/discharge timing of each circuit is determined by the electric signal of each other circuit. Also, the starter circuit starts delay when power source voltage charges to the predetermined voltage. Moreover, the charge/discharge circuit comprises a capacitor and a constant current source connected to the power source in series. Also, the delay signal generating circuit comprises the voltage detector circuit detecting the output voltage of each charge/discharge circuit means and the counter counting the number of oscillations of the voltage detector circuit.

In the above-mentioned voltage detector circuit, it is possible to rapidly discharge even at low power source voltage because the discharge starts just after the charge of main capacitor and charge value of main capacitor is small.

Also in the present invention, delay of output signal which is equal to the product of one charge/discharge time by count value of the counter generates.

BRIEF DESCRIPTION OF THE DRAWINGS

In the accompanying drawings:

FIG. 4 is a timing chart diagram for signals of the electrical signal delay circuit according to the second embodiment of the invention;

PREFERRED EMBODIMENTS OF THE INVENTION

The present invention is described with reference to the accompanying drawings.

Figure 1:
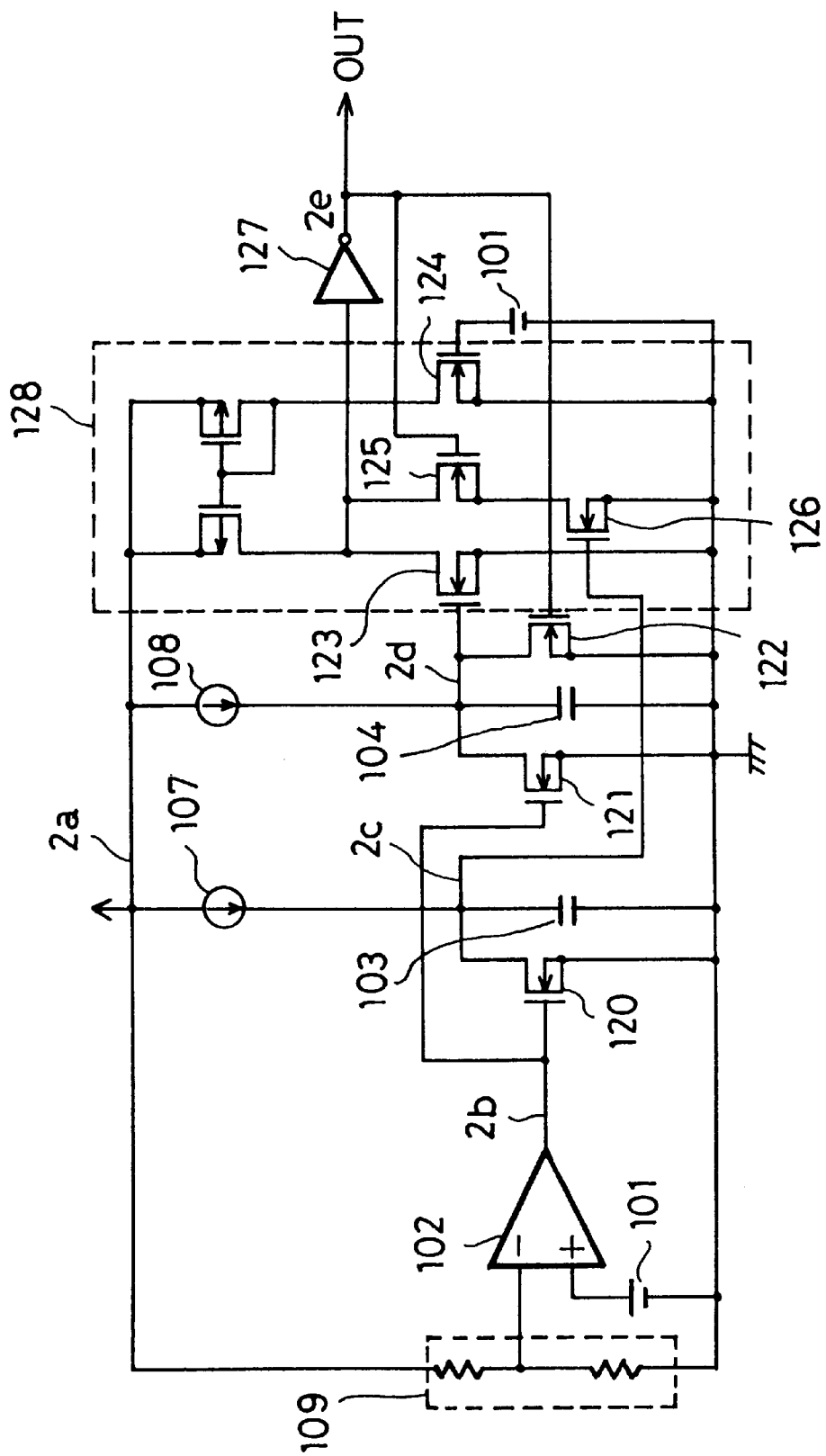
FIG. 1 is a circuit block diagram showing a first embodiment of the invention.

FIG. 1 is a circuit block diagram showing a first embodiment of the invention. A center tap of resistance group 109 which is a voltage dividing means (circuit) connected between power source and output of standard voltage circuit 101 is connected to an input of comparator 102. A starter circuit comprises these elements. The output of the comparator 102 is connected to gates of transistors 120 and 121 which are used for the selective discharge of capacitors 103 and 104 in parallel. The capacitors 103 and 104 are each charged by constant current sources 107 and 108 respectively. The respective connection points between capacitor 103 and transistor 120, and capacitor 104 and transistor 121 are also connected to gates of transistors 126 and 123 comprising input terminals of a comparator 128. Output voltage of a standard voltage circuit 101 is input to a gate of a transistor 124 which is another input terminal of the comparator 128. The gates of transistors 123, 124 and 126 are provided as terminals of the comparator 128 having many input terminals. Also, Pch transistors connected as current mirror functions as part of the comparator. The output of the comparator 128 is connected to an input of an inverter 127. An output of the inverter 127 is connected to a gate of a transistor 122 for charge and a gate of a transistor 125 connected to an input transistor 126 of the comparator 128.

Figure 2:
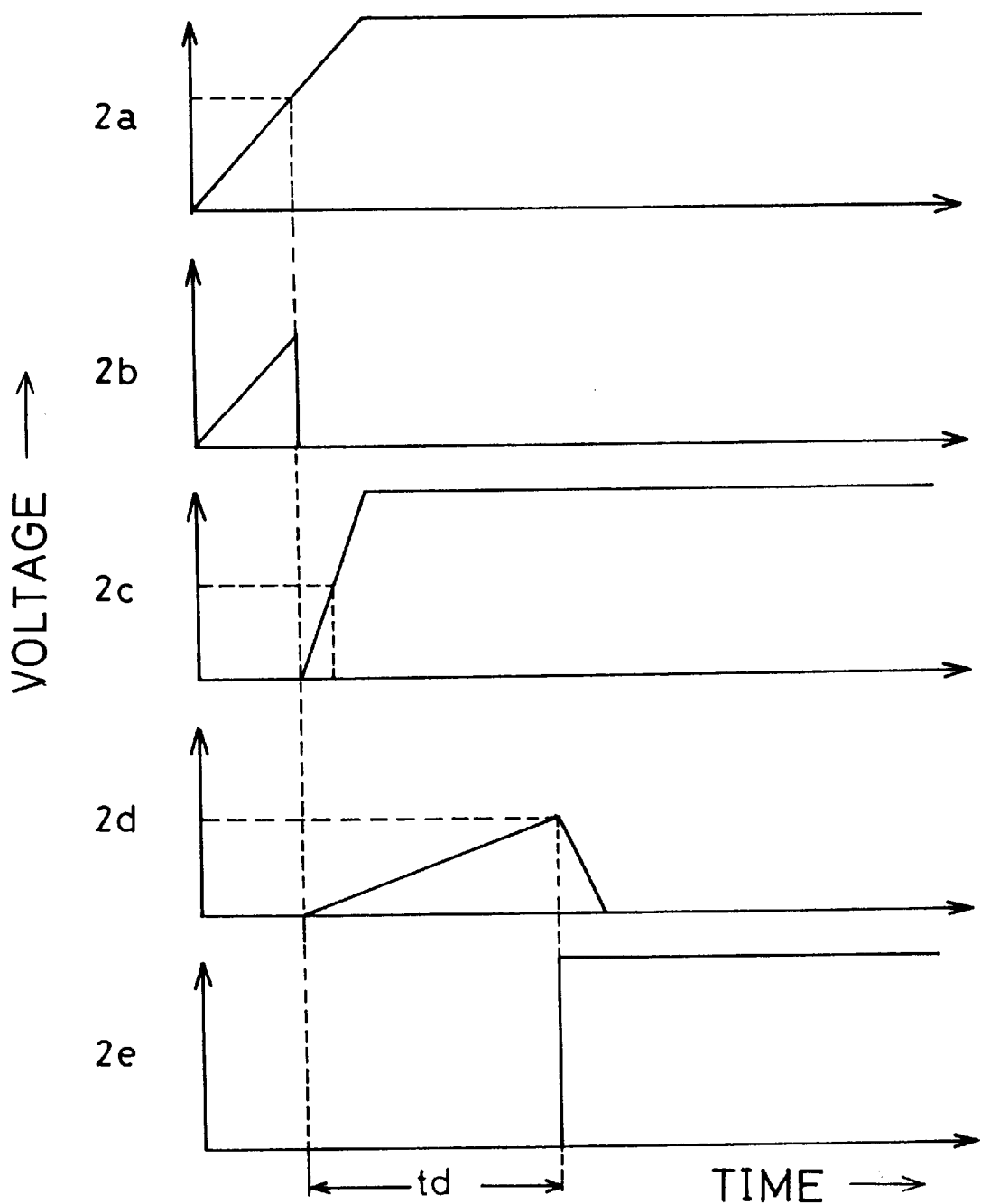
FIG. 2 is a timing chart diagram for signals of the electrical signal delay circuit according to the first embodiment of the invention.

Next, an operation of the circuit is described with reference to the timing chart of FIG. 2. The output 28 of the comparator 102 turns reversely to low voltage level and turns off the transistors 120 and 121 for discharge when power source voltage 2a rises and the negative input voltage of the comparator 102 goes over the output voltage of the standard voltage circuit 101. Current flows to the capacitors 103 and 104 from the constant current sources 107 and 108 respectively and discharge begins. Now, a capacitance value of the capacitor 103 is set up smaller than that of the capacitor 104. Therefore, a voltage of terminal 2c is larger in raising rate than that of terminal 2d. An output of the comparator 128 turns reversely and an output 2e of the inverter 127 turns to high voltage level when the voltage of the terminal 2d goes over the output voltage of the standard voltage circuit 101. Consequently, the charged capacitor 104 starts to discharge by activation of the transistor 122.

The output 2e of the inverter 127 holds the output level of the comparator 128 through the transistor because the voltage of terminal 2c already holds high level when the capacitor 104 starts to discharge. Therefore, the output 2e holds high voltage level. Namely, delay time td generates because the output 2e turns reversely to high voltage level after time td from time when the comparator 102 turns reversely to low voltage level. The delay time td is represented by the relation (1):

$$td = C_{104} \cdot V_{ref}/I \quad (1)$$

wherein $C_{104}$ is a capacitance value of the capacitor 104; I is a constant current value of the constant current source 108; and $V_{ref}$ is an output voltage of the standard voltage circuit 101. On the other hand, the capacitor 103 discharges when the power source voltage 2a goes down from the situation and the output of the comparator 102 turns reversely to high voltage level from low voltage level. Consequently, the output 2e turns reversely to low voltage level for instance.

Capacitance of the capacitor 103 is several pico farad. The capacitor 103 is thus able to be formed on a monolithic IC. On the other hand, capacitance of the capacitor 104 must be 10 nF by the formula (1) if $V_{ref}$=1V, I=100 nA for a delay time of 100 msec. As it is impossible to form on the monolithic IC, the capacitor must be attached outside.

Because only charge value of 10 nF×1V=10 nC is charged in the condenser 104 of the invention, it is possible to discharge in a short time even if the gate voltage of the transistor 122 for discharge is low, i.e., 1V.

Figure 3:
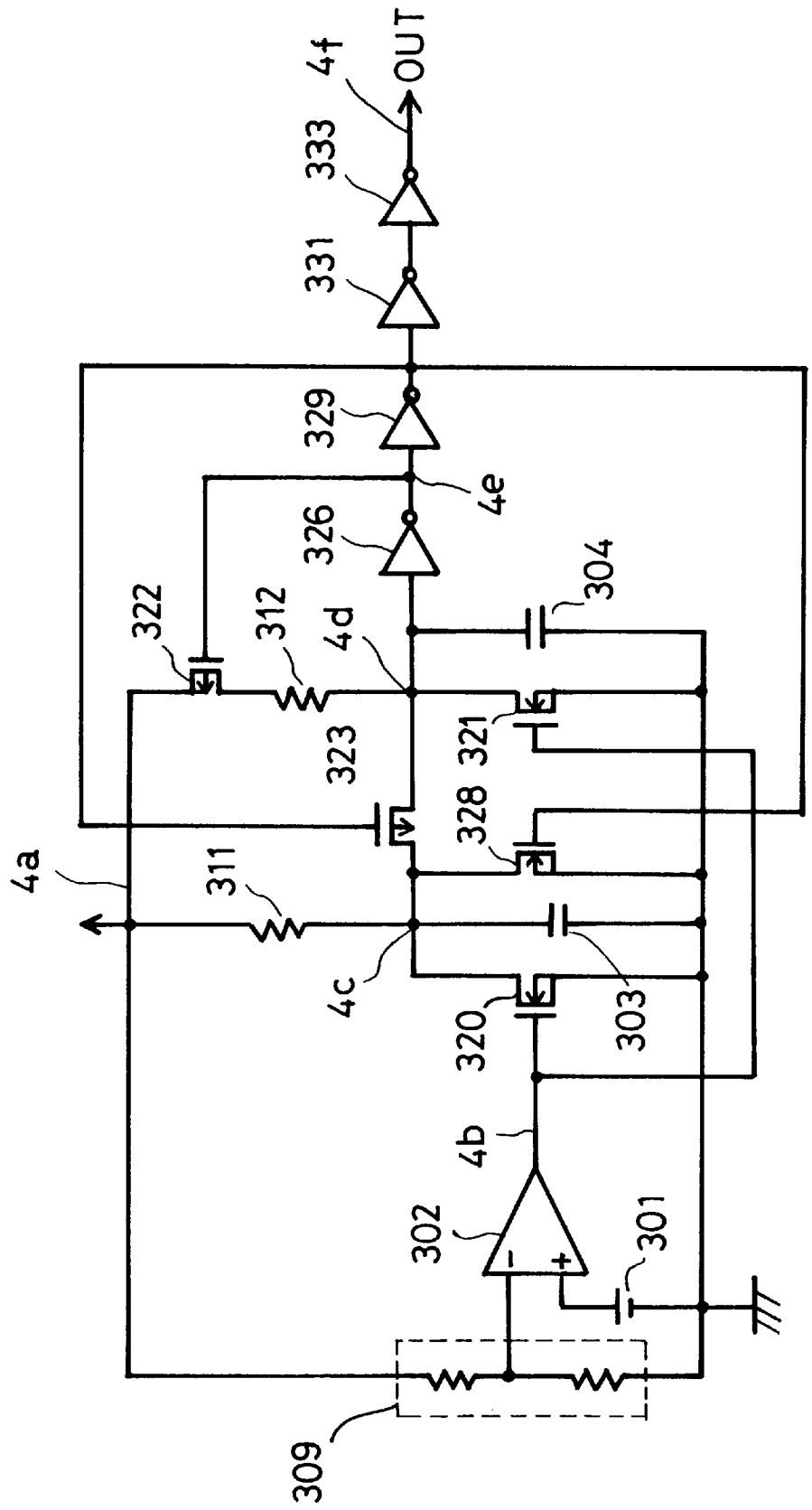
FIG. 3 is a circuit block diagram showing a second embodiment of the invention.

FIG. 3 is a circuit block diagram showing a second embodiment of the invention. A center tap of the resistance group 309 connected between power source and output of standard voltage circuit 301 is connected to the negative input of comparator 302. The output of the comparator 302 is connected to gates of transistors 320 and 321 connected for discharge to capacitors 303 and 304 in parallel. The capacitor 303 is charged through a resistance 311. Also capacitor 304 is charged through a resistance 312 and transistor 322. An output terminal 4e of an inverter 326 to which terminal 4d of transistor 321 and resistance 312 are input is connected to a gate of the transistor 322. A transistor 323 is connected between the terminal 4c of the transistor 320 and the resistance 311 and terminal 4d of the transistor 321 and the resistance 312. Also a transistor 328 is connected between the terminal 4c and ground. An output of an inverter 329 to which output terminal 4e inputs is connected to the gate of transistors 323 and 328 respectively. An output stage comprising inverters 331 and 333 are connected to the output of the inverter 329 in series and an output terminal 4f is formed at the output of the inverter 333.

Next, operation of the circuit is described with reference to the timing chart of FIG. 4. The output 4b of the comparator 302 turns reversely to low voltage level and turns off the transistors 320 and 321 when the power source voltage 4a rises and the negative input voltage of the comparator 302 goes over the output voltage of the standard voltage circuit 301. At this time, the transistor 323 turns on. The capacitors 303 and 304 start to charge by the above operation. The output 4e of the inverter 326 turns reversely to low voltage level. As the transistor 322 turns on and the transistor 323 turns off at the same time, current flows through the resistance 312 to charge the capacitor 304 rapidly and the voltage of the terminal 4d reaches the voltage of the power source voltage 4a. As the transistor 328 turns on at this time, the capacitor 303 discharges rapidly and the voltage terminal 4c reaches the ground voltage. As the transistor 323 thus operates as a switch, the discharge of the capacitor 303 and the charge of the capacitor 304 operate at the same time when the transistor 323 is off. The output 4f of the inverter 333 turns reversely to high voltage level when the output 4e of the inverter 326 switches. Namely the circuit of the invention detects voltage level and is able to generate a reverse signal after the predetermined delay time. As the transistors 320 and 321 turn on when the power source voltage 4a goes down (not shown in a figure), the charging capacitor 304 discharges rapidly and the output 4f turns reversely to low voltage level without delay time.

Figure 5:
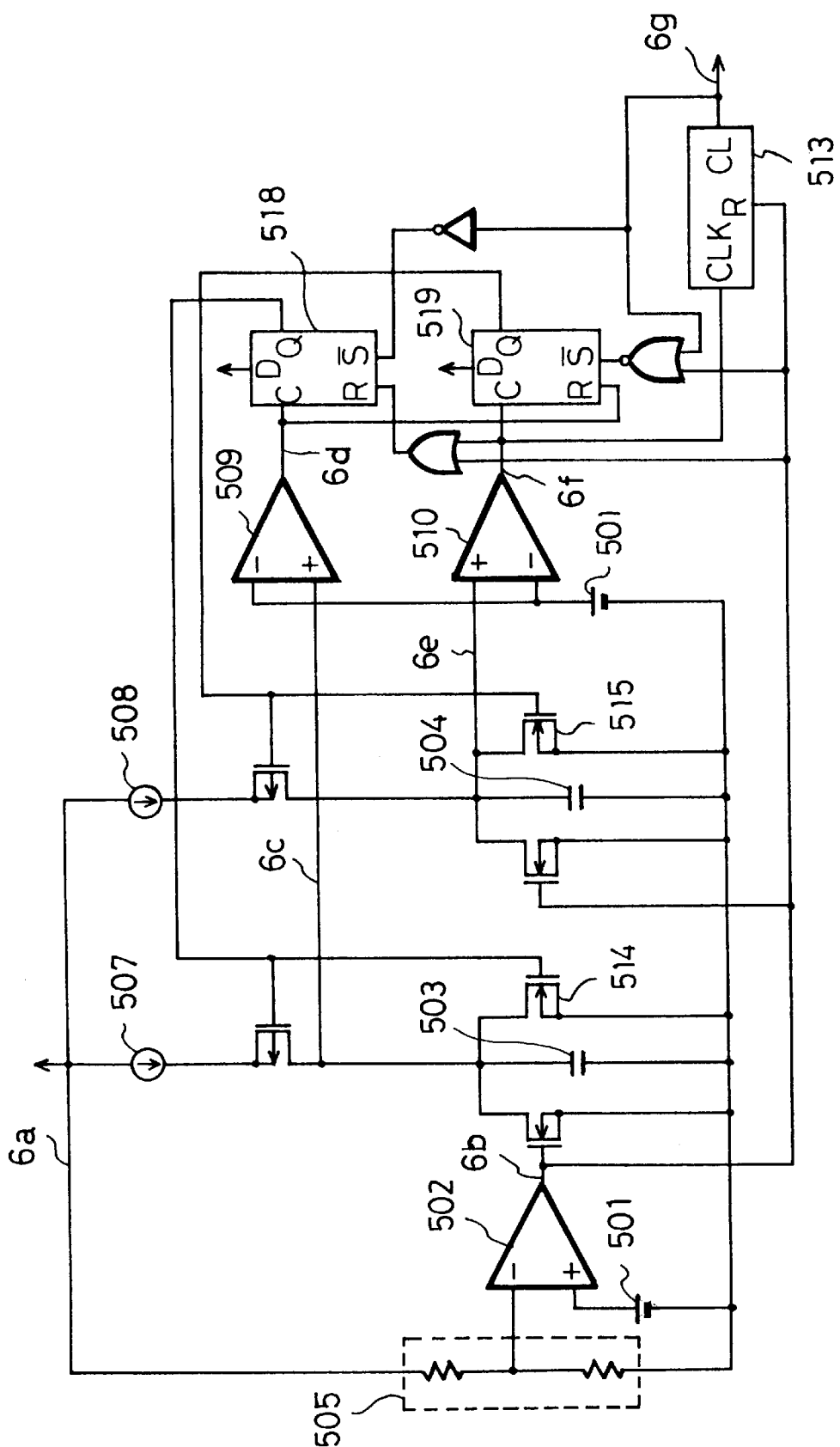
FIG. 5 is a circuit block diagram showing a third embodiment of the invention.

FIG. 5 is a circuit block diagram showing a third embodiment of the invention. A center tap of resistance group 505 connected between power source and output of a standard voltage circuit 501 is connected to the negative input of a comparator 502. A starter circuit comprises these elements. An output of the comparator 502 is connected to gates of Nch transistors formed in parallel with capacitors 503 and 504 and to a reset terminal of a counter 513. The capacitors 503 and 504 are connected to constant current sources 507 and 508 through a Pch transistor respectively and are charged with constant current. Positive voltage terminals of the capacitor 503 and 504 are connected to positive phase input terminal of comparators 509 and 510 respectively and are compared with the standard voltage circuit 501. Output signals 6d and 6f of the comparators 509 and 510 are inputted to clock terminals of one of D flip-flop 518 or 519 (hereinafter referred to a "DFF") respectively.

The Q output of each DFF is connected to gates of a respective Nch transistor for discharge and Pch transistor for current cut-off which are connected to capacitors 503 and 504 respectively. Also the signal $6_f$ is inputted to clock terminal of counter 513 and is counted. The counter 513 is reset by a signal 6b and the carry output signal 6g is used as a set signal for DFF. Also signals 6d and 6f are used as reset signals of each DFF and each generates charge starting signal of the capacitors 503 and 504.

Figure 6:
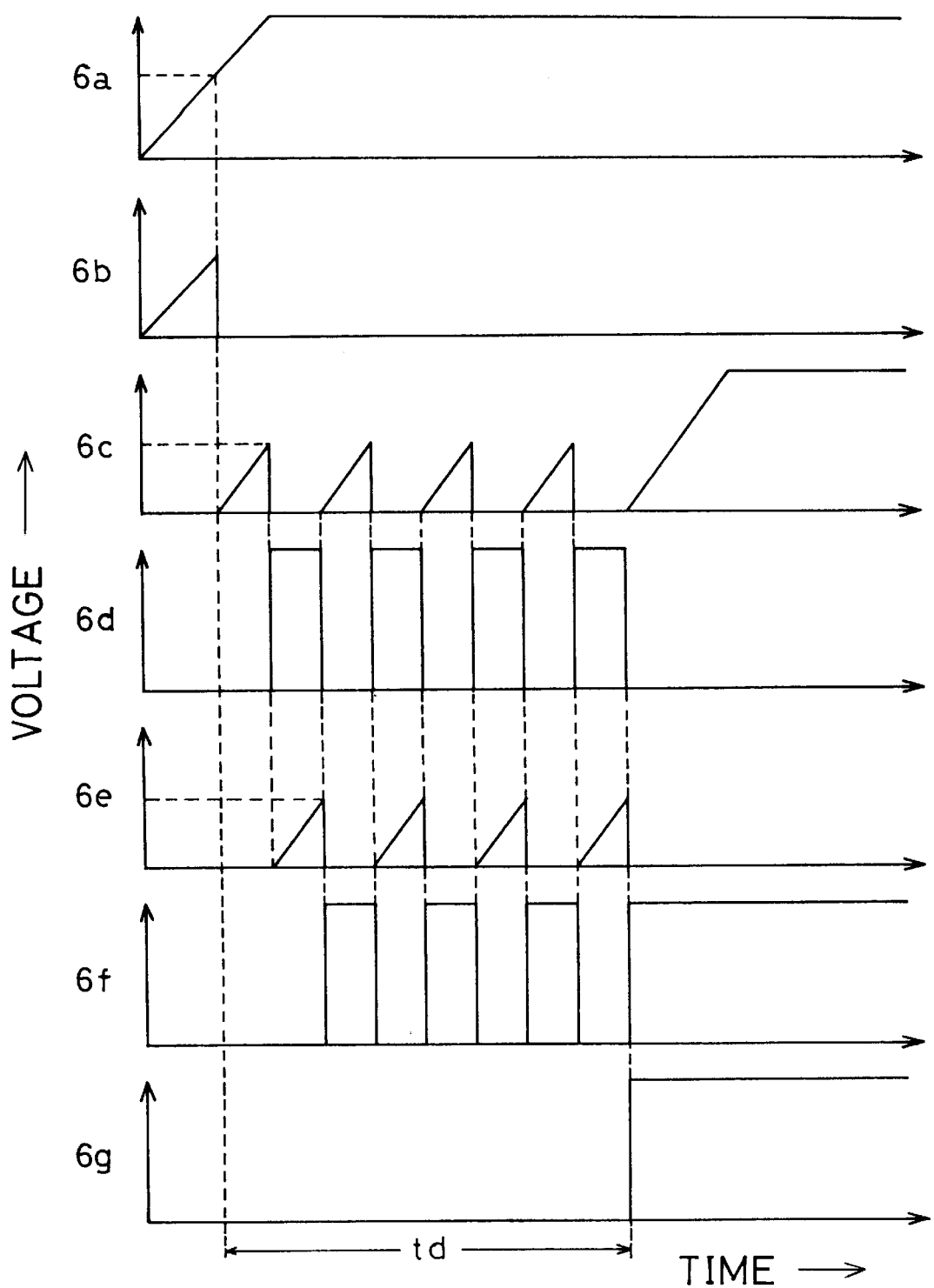
FIG. 6 is a timing chart diagram for signals of the electrical signal delay circuit according to the third embodiment of the invention.

Next, operation of the circuit is described with reference to the timing chart of FIG. 6. The output 6b of the comparator 502 inverts to low voltage level and cancels a reset of the counter 513 when power source voltage 6a rises and the negative phase input voltage of the comparator 502 goes over the output voltage of the standard voltage circuit 501. At the same time, the capacitor 503 starts a constant current discharge by the constant current source 507. The capacitor 504 is in the state of discharge at this time because Q output of DFF 519 is at a high voltage level. When the terminal voltage 6c goes over the output voltage of the standard voltage circuit 501, the output 6d of the comparator 509 turns reversely to high voltage level, DFF 518 is latched and Q output turns to high voltage level. Transistor 514 for discharge of and connected in parallel with the capacitor 503 turns on the same time and the capacitor 503 starts discharge. Also at the same time, DFF 519 is reset by the signal 6d. The output Q turns reversely to low voltage level and turns off Nch transistor 515 connected in parallel with the capacitor 504. Charge of the capacitor 504 starts through the constant current source 508.

When the terminal voltage 6e goes over the output voltage of the standard voltage circuit 501, the output 6f of the comparator 510 turns reversely to high voltage level, DFF 519 is latched and Q output turns to high voltage level. The transistor 515 for discharge of and connected in parallel with the capacitor 504 turns on at the time and the capacitor 504 starts to discharge. Also at the same time, DFF 518 is reset by the signal 6f. The output Q turns reversely to low voltage level and turns off Nch transistor connected in parallel with the capacitor 503. Charge of the capacitor 503 starts through the constant current source 507. After that, the above operation is repeated. The repeat is counted by inputting the signal 6f to the counter 513. The carry signal 6g is outputted when the pulse number of the signal 6f reaches full count value n of the counter 513. Therefore a time td from a moment when the output 6b of the comparator 502 turns to low voltage level till a moment when the carry signal 6g turns to high voltage level is a delay time and is represented by the relation (2):

$$td = 2t_f \times n \quad (2)$$

wherein n is a full count value of the counter 513 and $t_f$ is a time when the capacitor 503 charges till the output voltage of the standard voltage circuit 501 if the capacitance of the capacitor 503 is the same as that of the capacitor 504 and is represented by the relation (3):

$$t_f = C_{503} \cdot V_{ref} / I \quad (3)$$

wherein $C_{503}$ is a capacitance value of the capacitor 503; $V_{ref}$ is an output voltage of the standard voltage circuit 501; and I is a constant current value of the constant current source 507. Of course, it is also possible that a constant current value of the constant current source 507 is equal to that of the constant current source 508. Even if the capacitance and constant current value are not equal to each other, the circuit operates and generates a required delay time.

After the delay time td is generated, Q output turns to high voltage by setting DFFs 518 and 519 with the signal 6g; each Pch transistor for current cut-off is deactivated; and current consumption decreases. On the other hand, the counter 513 is reset and the signal 6g turns to low voltage level at the moment when the power source voltage 6a goes down from the above state and the output of the comparator 502 turns reversely from low voltage level to high voltage level.

The capacitors are small enough to be formed on a monolithic IC if the capacitance thereof is limited to several pico farad. For example, if the capacitance values of the capacitors 503 and 504 are 6 PF; $V_{ref}$ is 1V; the constant current value is 100 nA; and full count value of the counter is $2^{10}$, td is about 100 msec by the formulas (2) and (3).

As the time which sets the standards of delay is generated by the output change of the voltage detector circuit connected in series with the power source, the third embodiment of the invention accordingly is configured as a voltage detector circuit with delay function. The invention operates as a generic electrical signal delay circuit if the charge/discharge circuit is driven by a simple clock signal and not by the output of the voltage detector circuit.

Figure 7:
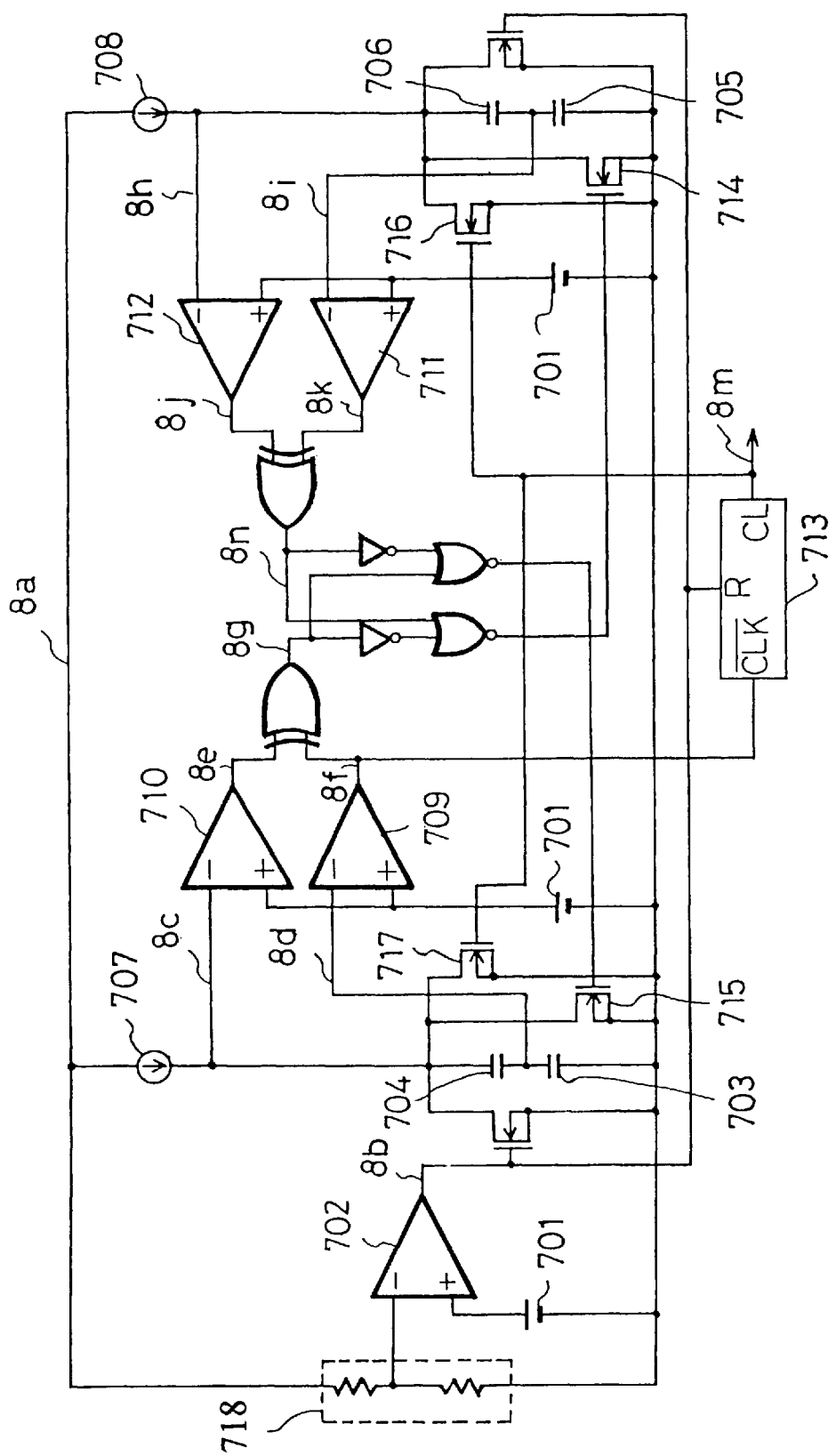
FIG. 7 is a circuit block diagram showing a fourth embodiment of the invention.

FIG. 7 is a circuit block diagram showing a fourth embodiment of the invention. A center tap of resistance group 718 connected between power source and output of a standard voltage circuit 701 is connected to input of a comparator 702. A starter circuit comprises these elements. An output of the comparator 702 is connected to gates of Nch transistors formed in parallel with two groups of capacitors and to a reset terminal of a counter 713. Two groups of capacitors having two charge/discharge circuits comprise two capacitors 703 and 704 and two capacitors 705 and 706 which are connected in series respectively. These capacitors are charged with constant current through constant current source 707 and 708. Terminal voltage 8d and 8c of capacitors 703 and 704 are inputted to comparators 709 and 710 respectively. Terminal voltage 8i and 8h of capacitors 705 and 706 are inputted to comparators 711 and 712. The other input: of these comparators are connected to the standard voltage circuit 701. Outputs 8e and 8f of the comparators 709 and 710 are inputted to a gate of a transistor 714 for discharging the condensers 705 and 706 through a logic circuit. Outputs 8k and 8j of the comparators 711 and 712 are inputted to a gate of a transistor 715 for discharging the capacitors 703 and 704 through a logic circuit. Also an output 8m of a counter 713 is inputted to gates of transistors 716 and 717 for discharge.

Figure 8:
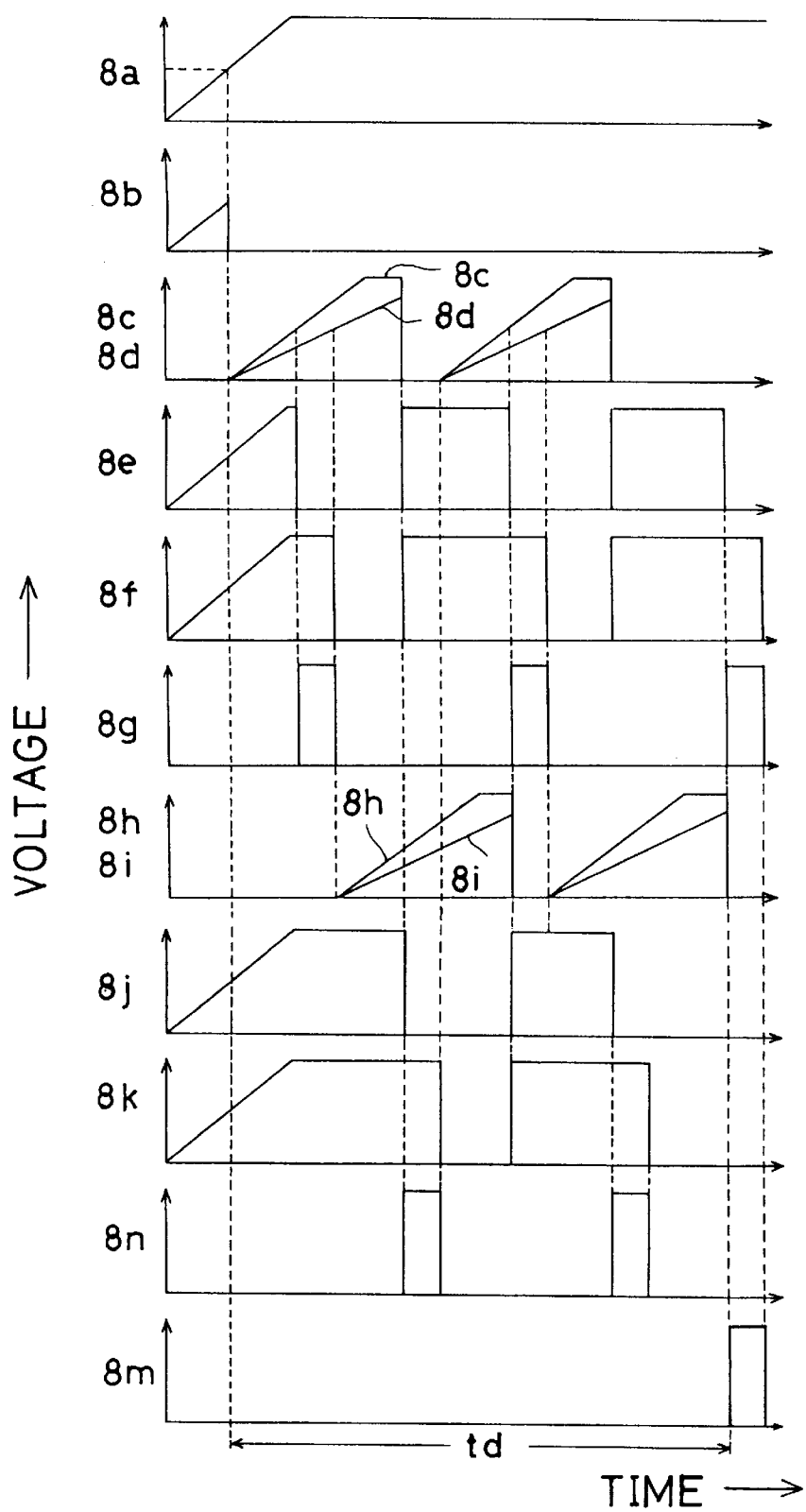
FIG. 8 is a timing chart diagram for signals of the electrical signal delay circuit according to the fourth embodiment of the invention.
Figure 9:
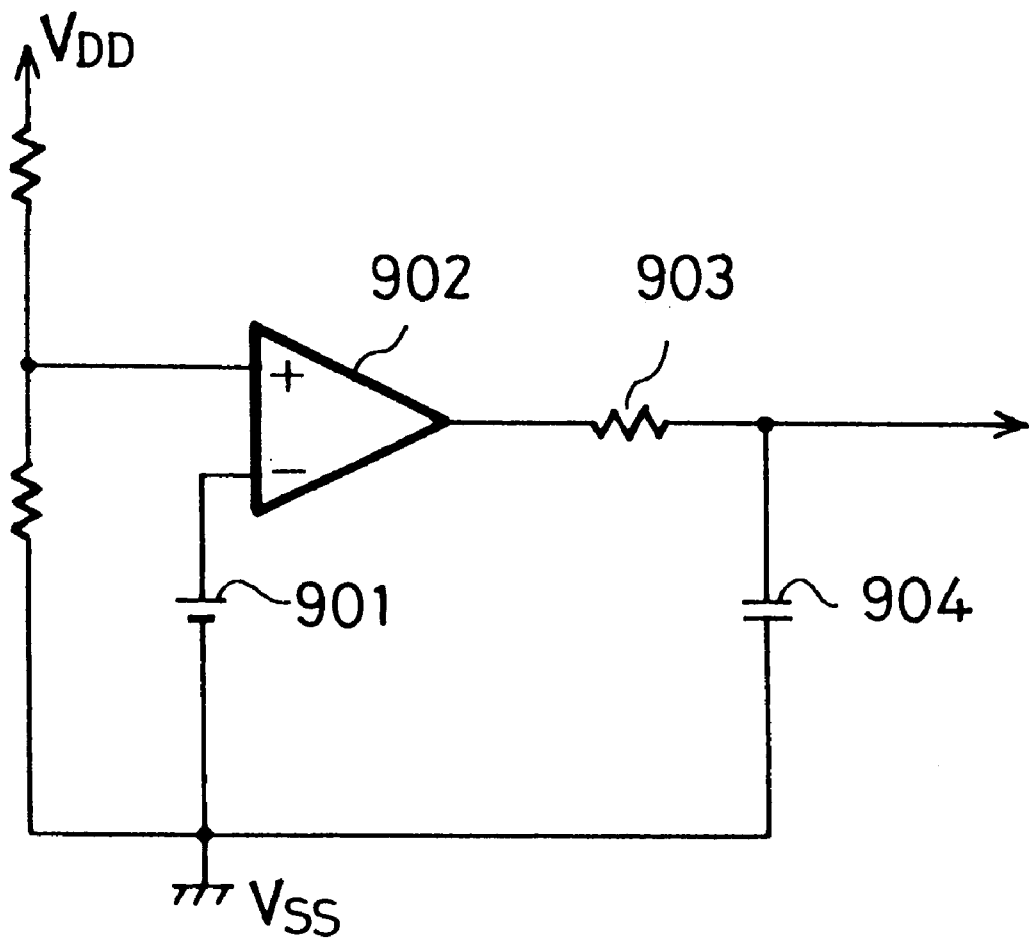
FIG. 9 is a circuit block diagram showing a conventional voltage detector circuit with delay function.

Next, operation of the circuit is described with reference to the timing chart of FIG. 8. The output 8b of the comparator 702 turns reversely to low voltage level and cancels a reset of the counter 713 when power source voltage 8b rises and the negative phase input voltage of the comparator 702 goes over the output voltage of the standard voltage circuit 701. The capacitors 703 and 704 start to charge by the constant current source 707 and the terminal voltages 8c and 8d start to rise. At any given time, the voltage 8c increases at a higher rate than the voltage 8d. A time width is generated by the difference of the voltage rising rate and makes a signal 8g which is the "exclusive or" of the outputs 8f and 8e of the comparators 709 and 710. The transistor 714 turns on and discharges the capacitors 705 and 706 by the signal 8g in the period. The capacitors 705 and 706 start to charge by the constant current source 708 when the signal 8g turns to low voltage level. At the time, the terminal voltages 8i and 8h of the capacitors 705 and 706 are different in raising rate as the above mentioned 8d and 8c. A time width which is generated by the difference of the voltage raising makes a signal 8n which is "exclusive or" of the outputs 8k and 8j of the comparators 711 and 712. The transistor 715 turns on and discharges the capacitors 703 and 704 by the signal 8n in the period. Two groups of the capacitors 703 and 704 and the capacitors 705 and 706 repeat alternately the above operation.

Also a signal turning reversely to high voltage level generates at the time when delay time passes after the comparator 702 turns reversely to low voltage level when the signal 8f is inputted as a clock of the counter 713; input pulse number is counted; and the carry signal 8m which is outputted at the full count of the counter 713. The delay time is represented by the relation (4):

$$td = t_f \times (2n+1) \quad (4)$$

wherein n is a full count value of the counter 713 and this a time when the capacitors 703 and 704 charge till the output signal 8f of the comparator 709 turns reversely from high voltage to low voltage level and is represented by the relation (5):

$$t_f = C_{703} \cdot V_{ref}/I \quad (5)$$

wherein $C_{703}$ is a capacitance value of the capacitor 703; $V_{ref}$ is an output voltage of the standard voltage circuit 701; and I is a value of the constant current source 707. Of course, it is supported that value of the capacitor 703 is equal to that of the capacitor 705; value of the capacitor 704 is equal to that of the capacitor 706; and the constant current value of the constant current source 707 is equal to that of the constant current source 708. Even if they are not equal to each other, the circuit operates and generates a required delay time. After delay time td generates, the transistors 716 and 717 turn on by the signal 8m; the groups of the capacitors keep discharge state; the clock input to counter 713 distinguishes; and the state is held, On the other hand, the counter 713 is reset and the signal 8m turns to low voltage level at the moment when the power source voltage 8a goes down.

The capacitors 703, 704, 705 and 706 are enough able to be formed on a monolithic IC if the capacitance of them is several pico farad. For example, if capacitance of the capacitors 703 and 705 is 5 PF; $V_{ref}$ is 1V; the constant value is 100 nA; and full count value of the counter is $2^{10}$, td is about 100 msec by the formulas (4) and (5).

Through the pulse discharging the capacitors 705 and 706 generates by the capacitors 703 and 704 in the fourth embodiment of the invention, it is possible that the same discharge pulse as the above discharge pulse generates using one capacitor instead of two capacitors 703 and 704 by the way inputting two groups of standard voltage circuit, value of which is different each other, to the comparators 709 and 710. Also the embodiment of the invention is the voltage detector circuit with delay function, as the power source voltage detector circuit is used as the starter circuit. If the timing states by a simple pulse signal without the starter circuit, the embodiment of the invention operates as a simple delay circuit.

The present invention provides an electrical signal delay circuit at a low price and a voltage detector circuit with delay function integrated in a monolithic IC by using capacitors which have capacitance range of capacitor being formed on a monolithic IC easily.

What is claimed is:

1. An electric signal delay circuit comprising: input means for detecting an imput signal; charge/discharge means connected to the input means and comprising a plurality of charge storage elements and means for selectively charging and discharging the respective charge storage elements in response to detection of an input signal; and delay signal generating means for detecting a charge level of the respective charge storage elements and for generating an output signal when the detected charge is indicative of a predetermined delay time from detection of the input signal; wherein the delay signal generating means comprises means for generating a first output signal when respective charge storing elements reach a respective predetermined charge level, and means for generating a second output signal in accordance with the number of first output signals.

2. An electrical signal delay circuit according to claim 1; wherein the charge/discharge means includes means for commencing a charging operation of each of the plural charge storing elements at the same time; and wherein the delay signal generating means comprises a comparator circuit for comparing the charge level of each charge storing element with a respective predetermined reference level and producing an output when a selected one of the plural charge storing elements reaches a respective predetermined charge level.

3. An electrical signal delay circuit according to claim 1; further comprising a plurality of resistance elements each connected in series with a respective charge storing element; and wherein the delay signal generating means includes means for selectively charging a respective charge storing element until the voltage thereacross reaches the level of an input power source voltage, selectively discharging a respective charge storing element until the voltage thereacross reaches a ground voltage, and providing isolation between a plurality of time delay circuits each comprising a respective charge storing element and corresponding resistance element.

4. An electric signal delay circuit according to claim 1; wherein the charge storing elements each comprise at least one capacitor.

5. An electric signal delay circuit according to claim 1; wherein the charge/discharge means includes switch elements; and the delay signal generating means includes means for controlling the charge/discharge means to selectively drive the switch elements to selectively charge and discharge respective charge storing elements.

6. An electric signal delay circuit according to claim 1; wherein the means for generating respective first output signals comprises comparator means for comparing the charge level of respective charge storing elements with a respective predetermined level, and the means for generating a second output signal comprises counting means for counting the number of first output signals and generating a count output signal.

7. An electric signal delay circuit according to claim 1; wherein the plurality of charge storing elements comprises two capacitors; the charge/discharge means includes means for controlling the charging and discharging of the capacitors; and the delay signal generating means comprises comparator means for comparing the charge level of each capacitor with a respective predetermined level and for generating an output signal when the smaller of the two capacitors reaches a predetermined level.

8. An electric signal delay circuit comprising: input means for detecting an input signal; charge/discharge means connected to the input means and comprising a plurality of charge storage elements and means for selectively charging and discharging the respective charge storage elements in response to detection of an input signal; and delay signal generating means for detecting a charge level of the respective charge storage elements and for generating an output signal when the detected charge is indicative of a predetermined delay time from detection of the input signal; wherein the delay signal generating means comprises comparator means for comparing the charge level of respective charge storing elements with a respective predetermined reference and producing a respective first output signal when the charge level of each charge storing device reaches the corresponding predetermined level, and counting means for counting respective first output signals to produce a delayed output signal in accordance with the number of first output signals.

9. An electrical delay circuit comprising: input means for detecting an input signal; charge/discharge means connected to the input means and comprising a plurality of charge storage elements and means for selectively charging and discharging the respective charge storage elements in response to detection of an input signal; and delay signal generating means for detecting a charge level of the respective charge storage elements, generating first output signal when respective charge storage elements reach a respective predetermined level, and generating a delayed second output signal according to the number of first output signals.

10. An electrical signal delay circuit according to claim 9; wherein the charge/discharge means includes means for charging a first capacitor, and for charging a second capacitor a predetermined time after the first capacitor starts to charge; and wherein the delay signal generating means comprises a first comparator for detecting when the charging voltage of the first capacitor reaches a first predetermined voltage level, a first latch circuit connected to be latched by an output signal of the first comparator, a second comparator for detecting when the charging voltage of the second capacitor reaches a predetermined voltage level, a second latch circuit connected to be latched by an output signal of the second comparator, and a counter circuit for counting the number of latches of one of the first and second latch circuits.

11. An electrical signal delay circuit according to claim 9; wherein the charge/discharge means comprises a first group of capacitors connected in series, and a second group of capacitors which are connected in series and which start to charge a predetermined time after the first group starts to charge; and wherein the delay signal generating means comprises a first comparator group for detecting when the charging voltage of the first group of capacitors reaches respectively a predetermined voltage value, a second comparator group for detecting when the charging voltage of said second group of capacitors reaches respectively a second predetermined voltage value, and a counter circuit for counting the number of output signals form one of the first and second comparator group.

12. An electric signal delay circuit according to claim 9; wherein the delay signal generating means comprises counting means for counting the number of first output signals and for generating a delayed second output signal when the number reaches a predetermined amount.

* * * * *